United States Patent
Asam

(10) Patent No.: US 7,689,181 B2
(45) Date of Patent: Mar. 30, 2010

(54) CIRCUIT ARRANGEMENT FOR REGULATING A DC SIGNAL COMPONENT AND MOBILE RADIO TRANSMITTER

(75) Inventor: Michael Asam, Wollomoos (DE)

(73) Assignee: Infineon Technologies AG, Munich (DE)

( * ) Notice: Subject to any disclaimer, the term of this patent is extended or adjusted under 35 U.S.C. 154(b) by 229 days.

(21) Appl. No.: 10/484,379

(22) PCT Filed: Jul. 24, 2002

(86) PCT No.: PCT/DE02/02712

§ 371 (c)(1),
(2), (4) Date: Jan. 20, 2004

(87) PCT Pub. No.: WO03/012977

PCT Pub. Date: Feb. 13, 2003

(65) Prior Publication Data

US 2004/0157568 A1    Aug. 12, 2004

(30) Foreign Application Priority Data

Jul. 27, 2001   (DE)   ................. 101 36 741

(51) Int. Cl.
*H04B 1/04*    (2006.01)
(52) U.S. Cl. ................. 455/127.1; 455/127.2
(58) Field of Classification Search ............ 455/127.1, 455/127.2, 110; 332/103
See application file for complete search history.

(56) References Cited

U.S. PATENT DOCUMENTS

| | | | | |
|---|---|---|---|---|
| 4,563,775 A * | 1/1986 | Yokosuka | ............. | 455/126 |
| 5,471,665 A | 11/1995 | Pace et al. | | |
| 6,052,572 A * | 4/2000 | Imura | ............. | 455/343.5 |
| 6,091,934 A * | 7/2000 | Berman et al. | ............. | 455/13.4 |
| 6,154,158 A | 11/2000 | Walker | | |
| 6,359,523 B1 * | 3/2002 | Kuwano | ............. | 332/103 |
| 6,438,358 B1 * | 8/2002 | Higuchi | ............. | 455/84 |

FOREIGN PATENT DOCUMENTS

| EP | 0 655 841 A1 | 5/1995 |
|---|---|---|
| EP | 0 693 823 A1 | 1/1996 |
| WO | 99/26361 | 5/1999 |

OTHER PUBLICATIONS

English language abstract of European Patent EP 0 693 823 A1.

* cited by examiner

*Primary Examiner*—Patrick N Edouard
*Assistant Examiner*—Michael T Thier
(74) *Attorney, Agent, or Firm*—Eschweiler & Associates, LLC

(57) ABSTRACT

In a circuit arrangement for regulating a DC signal component of a signal that is input to a frequency mixer, the regulation comprises a detector which detects the DC component of the input signal. A comparator compares the DC component with a reference value, and drives an apparatus for influencing the DC component based on the comparison.

20 Claims, 2 Drawing Sheets

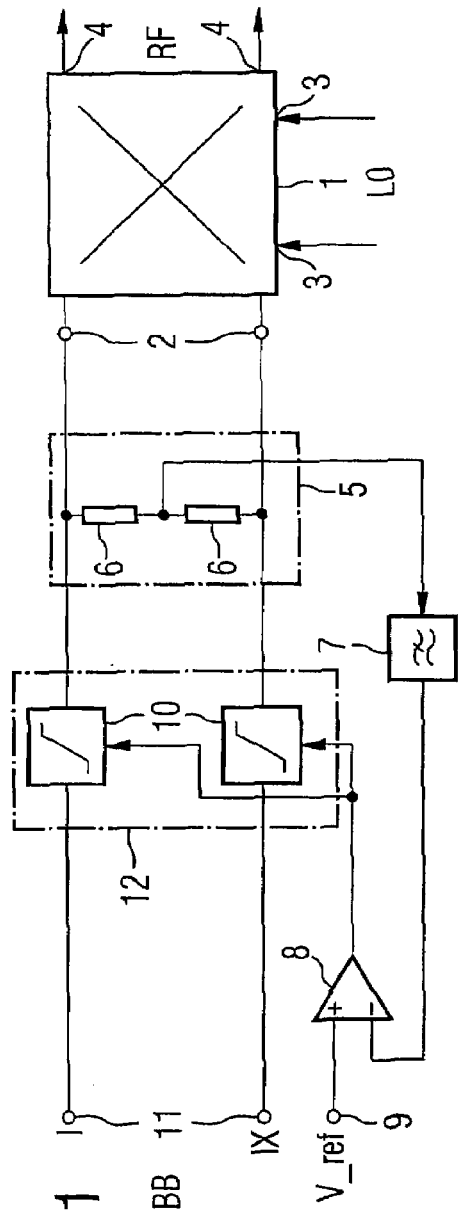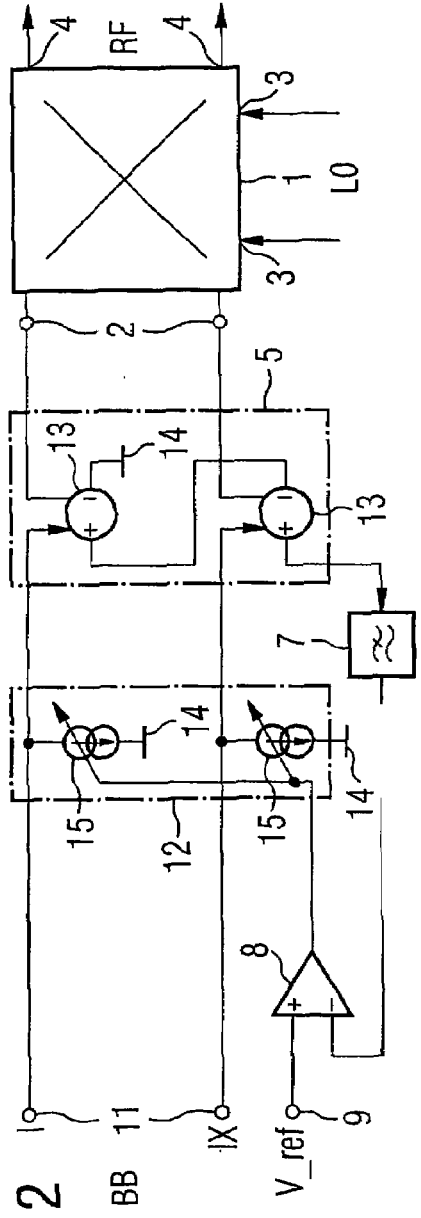

CIRCUIT ARRANGEMENT FOR REGULATING A DC SIGNAL COMPONENT AND MOBILE RADIO TRANSMITTER

FIELD OF THE INVENTION

The present invention relates to a circuit arrangement for regulating a signal DC component and a mobile radio transmitter having the circuit arrangement.

BACKGROUND OF THE INVENTION

Particularly in the case of analogue multiplier circuits which are designed and operated as radiofrequency mixers, a signal with a fixed, previously known DC component has to be provided at the signal input at which the useful signal is fed in. Depending on whether the input of the radiofrequency mixer is designed as a current input or as a voltage input, the DC component of the input signal has to be provided either as a DC voltage offset or as a DC current offset.

In mobile radio applications, two functional units are usually provided, namely a baseband signal processing and also a radiofrequency processing usually designed using analogue circuitry, which are normally arranged in separate integrated circuits (ICs). In the transmission direction, signals to be transmitted are processed in a baseband processor in accordance with the desired channel coding and modulation methods and converted into analogue, that is to say time- and value-continuous, signals at the output of the baseband block in a digital/analogue converter. This analogue signal provided at the output of the baseband chip is usually provided as a complex-valued signal with an in-phase component I and a quadrature component Q, I and Q signal component usually being carried as symmetrical or differential signals.

In the subsequent functional block, which effects the frequency conversion onto a radiofrequency carrier by means of a modulation, for example a quadrature modulation, provision is made of the radiofrequency mixers described in the introduction, which enable the frequency conversion from the baseband to a frequency in the radiofrequency range and, on the output side, are coupled to a transmission antenna, for example. The baseband processing block described and also the functional block of analogue design connected downstream are usually arranged on a respective integrated semiconductor chip. Since a signal with a fixed, previously known DC component has to be provided on the input side at the radiofrequency mixer, it is necessary for the connected baseband chip to provide a matching DC component at its output.

In order to ensure operation at a desired operating point of the frequency mixer, the DC voltage or DC current component on the input side is permitted to vary only within defined tolerances. However, the different baseband chips available have different DC components at the output which, moreover, are additionally subject to manufacturing tolerances.

It is an object of the present invention to specify a circuit arrangement for regulating a signal DC component which can be connected to an input of a radiofrequency mixer and enables the connection to different baseband signal processing circuits, and also a mobile radio transmitter having the circuit arrangement.

SUMMARY OF THE INVENTION

According to the invention, the object with regard to the circuit arrangement is achieved by means of a circuit arrangement for regulating a signal DC component, having a modulator for the frequency conversion of an input signal which can be fed in at an input of the modulator, a detector for the detection of a DC component of the input signal, which is connected to the input of the modulator, a comparator having a first input, which is coupled to an output of the detector, and having a second input, at which a desired signal can be fed in, and a means for influencing the DC component of the input signal, which is connected upstream of the detector, having a control input connected to an output of the comparator.

The proposed principle provides a circuit arrangement which, on the input side at the modulator, adjusts the DC component of the input signal to a predeterminable desired value which is suitable for the operation of the modulator and may serve for example for setting the operating point thereof. This results in an independence of output signal DC components of a block connected upstream, for example of a baseband signal processing unit.

If the input signal is present as a symmetrical signal, that is to say as a push-pull signal, then the common-mode component is understood as DC component of the signal.

If the input of the modulator is designed as a voltage input, then the DC voltage component is understood as DC component. If the input of the modulator is designed as a current input, then the DC current component of the input signal is understood as DC component.

The present principle affords the additional advantage not only of compensating for manufacturing-dictated tolerances but also of compensating for temperature-dictated and ageing-dictated drift effects and a consequently varying DC component of the input signal.

In one preferred embodiment of the present invention, a low-pass filter is provided, which couples the output of the detector to the first input of the comparator.

The interposition of a low-pass filter is advantageous particularly when the input signal is carried on one line, in so-called single-ended fashion. Moreover, the low-pass filter improves the stability of the regulating loop.

In a further preferred embodiment of the present invention, the input of the modulator, and the detector are designed for processing a symmetrical input signal.

The so-called differential signal transmission of the input signal affords, in addition to the higher interference immunity, the possibility of simplified determination of the DC component of the input signal.

The low-pass filter may be omitted when the signal is carried out as a symmetrical input signal.

In a further preferred embodiment of the present invention, the detector is designed for detecting the DC voltage component of the input signal.

If the modulator input is designed as a voltage input, that is to say such that it is at high impedance, then a detection of the DC voltage component is advantageously provided for determining the offset of the input signal in the detector.

In a further preferred embodiment of the present invention, the detector comprises two resistors, which are connected by one connection to a respective input terminal of the symmetrical input of the modulator and are connected by a further connection to one another and to the output of the detector.

Other realizations of the detector may also be provided for determining the DC voltage component, that is to say the common-mode signal of the symmetrical signal. The described embodiment with two resistors, which preferably have the same resistance, constitutes a particularly simple circuit realization.

When the input signal is present as a voltage signal, the means for influencing the DC component of the input signal, which is connected upstream of the detector, is preferably designed as a level shifter which adds the DC component provided by the comparator to the DC component of the input signal, or subtracts it therefrom.

In a further preferred embodiment of the invention, the detector is designed for detecting the DC current component of the input signal.

When the present regulating circuit is connected to a current input of a modulator, for example of a radiofrequency mixer, the detector is preferably designed for detecting the DC current component of the input signal.

In a further preferred embodiment of the present circuit arrangement, the detector comprises two series-connected, current-controlled voltage sources, having a respective control input coupled to a respective input terminal of the symmetrical input of the modulator, the series connection of the two current-controlled voltage sources being coupled to the output of the detector.

In a particularly simple circuit realization, the two current-controlled voltage sources may be constructed with resistors.

Controlled current sources are preferably connected to the output of the comparator, which current sources operate on a respective input terminal of the modulator at the input thereof and, on the input side, are in each case connected to the current-controlled voltage sources. The circuit arrangement described thus regulates two controlled current sources at the input of the modulator in order thus to increase or decrease the DC current component in accordance with the prescribed reference value.

In the case where the limiting frequency of the low-pass filter arranged in a feedback path of the regulating loop is chosen to be sufficiently low, the circuit arrangement described, instead of the symmetrical embodiment, may also be embodied with a signal being carried on only one line, in so-called single-ended fashion.

In a further preferred embodiment of the present invention, the modulator comprises at least one frequency mixer, having a first input, which is connected to the input of the modulator, having a second input, to which a signal having a carrier frequency can be fed, and having an output, at which a modulated radiofrequency signal can be derived.

If the modulator is designed as a quadrature modulator, then preferably two frequency mixers are provided, of which one frequency mixer is driven by an in-phase component and a further frequency mixer is driven by a quadrature component of a useful signal. In this case, it is possible to provide the described circuit arrangements for DC component regulation preferably at both useful signal inputs of the frequency mixers.

The principle described can preferably be applied to transmission arrangements, in particular in mobile radio. The principle described may be used for example in the case of homodyne and heterodyne transmission architectures. If a plurality of upward frequency mixers are connected in succession, then it may be advantageous to provide a circuit arrangement as described in each case at the useful signal inputs of the plurality of frequency converters connected in succession.

BRIEF DESCRIPTION OF THE DRAWINGS

The invention is explained in more detail below using a plurality of exemplary embodiments with reference to the drawings.

In the figures:

FIG. 1 shows a first exemplary embodiment of the invention on the basis of a simplified block diagram applied to a frequency converter having a voltage input, FIG. 2 shows a further exemplary embodiment of the present principle applied to a frequency converter having a current input on the basis of a simplified block diagram.

DETAILED DESCRIPTION

Figure 3:
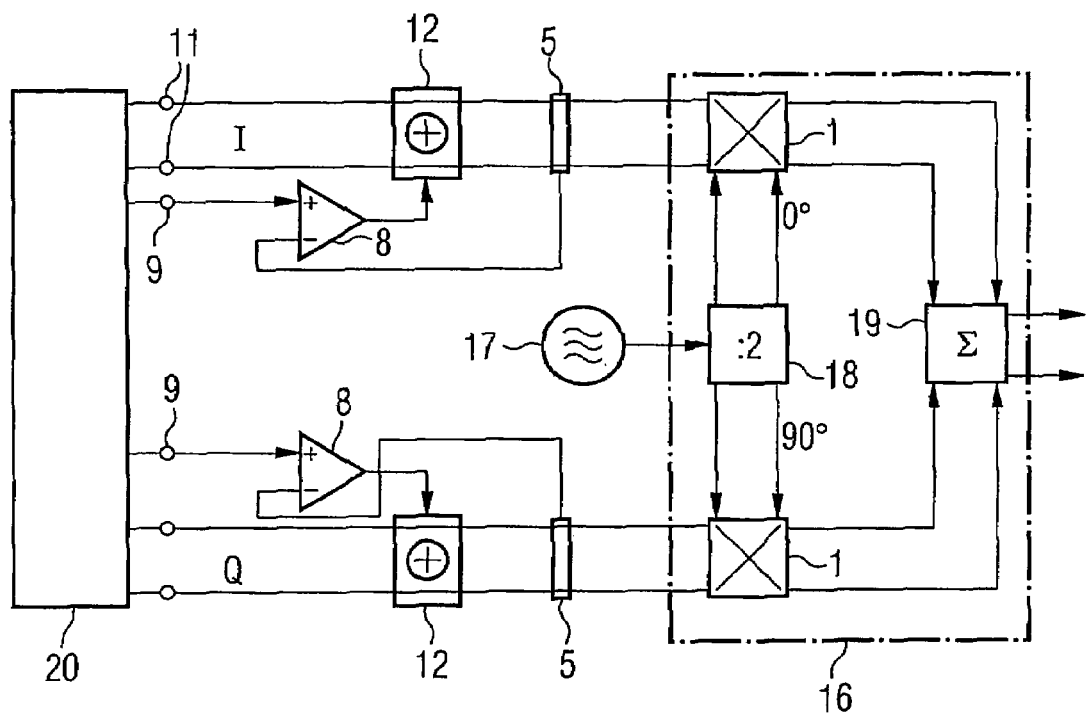
FIG. 3 shows the described principle applied to a quadrature modulator in a mobile radio transmitter on the basis of a simplified block diagram.

The reference symbols in the drawings are:
1 Mixer
2 Input
3 LO input
4 Output
5 Common-mode detector
6 Resistor
7 Low-pass filter
8 Comparator
9 Connection
10 Level shifter
11 Input connection
12 Means for influencing the common-mode level
13 Controlled voltage source
14 Reference potential connection
15 Controlled current source
16 Quadrature modulator
17 Oscillator
18 Divider
19 Summer
20 Baseband chip
I In-phase signal branch
Q Quadrature signal branch.

FIG. 1 shows a radiofrequency mixer 1 designed as a frequency converter, having an input 2 for feeding in a symmetrical baseband signal, a local oscillator input 3 for feeding in a signal having a carrier frequency, and having a radiofrequency output 4. The inputs 2, 3 and the output 4 of the radiofrequency mixer 1 are in each case designed symmetrically for carrying differential signals. The radiofrequency mixer 1 converts a baseband signal present at its useful signal input 2 into one in the radiofrequency range.

A detector 5 is connected to the input 2 of the radiofrequency mixer 1, said detector comprising two resistors 6, which have an identical resistance. The resistors 6 are connected by one respective connection to a respective terminal of the symmetrical input 2 and are connected by a further connection to one another to form an output of the detector 5. The inverting input of a comparator 8 designed as an operational amplifier is connected to said output of the detector 5 in order to form a negative feedback loop of a regulating arrangement via a low-pass filter 7 designed as an AC element. The noninverting input of the comparator 8 is designed with a connection 9 for feeding in a desired voltage level. The comparator 8 has an output, to which a respective control input of a level shifter 10 is connected. The level shifters 10 are connected by their outputs directly to the input of the detector 5 and thus also to the input 2 of the mixer 1. A baseband signal or a signal component of a complex-valued baseband signal can be fed as symmetrical signal to the inputs of the level shifters 10. The inputs of the level shifters 10 are connected to a symmetrical baseband input 11, which can be connected for example to the output of a baseband signal processing unit. The level shifters 10 together form a means for influencing the DC component of the input signal that can be fed in at the input 2 of the mixer 1 and are designed as source followers in the present exemplary embodiment.

FIG. 1 only shows the regulating circuit for the in-phase signal path of a mobile radio transmitter; for the quadrature signal path it is necessary to provide the same connections of a mixer input of a further mixer, as in FIG. 1.

In order for it to function correctly, the mixer 1 requires a fixed, previously known common-mode voltage, that is to say a fixed DC, Direct Current, voltage level at the input terminals 2. This common-mode DC voltage component is provided by means of the resistors 6 having an identical value at the output of the comparator 8 and is passed as an actual value to the negative operational amplifier input of the comparator 8. In the symmetrical embodiment described, low pass filter 7 is not necessarily present and may also be replaced by a short circuit. Particularly in the case of a single-ended embodiment of the mixer input 2, the low-pass filter 7 suppresses the useful signal to transmit it. Moreover, by being arranged in the feedback path of the regulating loop, low-pass filter 7 provides for the stability of said regulating loop.

The operational amplifier 8 compares the filtered actual value with a desired value—provided at the connection 9—of the common-mode signal component at the input 2 and, depending on a deviation between desired signal and actual signal, drives two level shifters 10, which vary the DC voltage potential at the output of the level shifters 10 depending on said deviation. As a result of this, after transient recovery of the regulating loop, a common-mode voltage corresponding to the desired value fed in at the connection 9 is established at the mixer input 2. In this case, the gate-source voltage of the level shifters 10 designed as source followers depends on a current in the MOS field-effect transistor 10.

If, in a modification of the regulating arrangement in accordance with FIG. 1, an asymmetrical signal transmission on one line is chosen instead of the symmetrical signal transmission, then the limiting frequency of the low-pass filter 7 is to be set comparatively low in order to filter out useful signals and not permit them to concomitantly influence the regulation. An exemplary application is given in mobile radio transmitters in accordance with UMTS, Universal Mobile Telecommunication System, since there the baseband signals are at comparatively high frequency.

The circuit in accordance with FIG. 1 enables the mixer 1 to be operated at its desired operating point and at the same time allows an integrated circuit with a virtually arbitrary output signal DC component to be connected upstream of the circuit shown. Moreover, ageing- and temperature-dictated drift effects are corrected, thereby avoiding a drifting away of the operating point of the mixer 1.

FIG. 2 describes the principle according to the invention applied to a radiofrequency mixer 1 in which the useful signal input 2 is designed as a current input. As a result of this, only detector 5 and the means for influencing the common-mode signal component 12 are embodied differently, in a manner adapted thereto, than in the circuit in accordance with FIG. 1; for the rest, the block diagram in accordance with FIG. 2 corresponds in terms of construction and function to that of FIG. 1 and will not be repeated again at this point.

In accordance with FIG. 2, the detector 5 comprises two current-controlled voltage sources 13 each having a control input and two load connections. On the load side, the controlled voltage sources 13 are connected to one another in a series circuit which is connected between a reference potential connection 14 and an input of the low-pass filter 7. The control inputs of the current-controlled voltage sources 13 are in each case connected to the symmetrical input 2 of the mixer 1 via a respective input terminal and also to the symmetrical output of the means for influencing the common-mode signal 12.

A respective controlled current source 15 is connected by its control input to the comparator 8 on the output side, which current sources are coupled to the symmetrical input 2 of the mixer 1 on the load side via the control inputs of the controlled sources 13. The controlled current sources 15 are furthermore in each case connected to reference potential connection 14.

In accordance with FIG. 2, the mixer 1 has a differential current input for feeding in a baseband input signal. The baseband chip which can be connected to the current input 11 of the circuit in accordance with FIG. 2 supplies the baseband useful signal in the form of a current signal, with a fixed common-mode (CM) direct-current (DC) component. In order to set this CM-DC current to a value suitable for the mixer 1, in particular with regard to the operating point thereof, it is converted into a voltage with the aid of two current-controlled voltage sources 13, which may be designed as resistors in a particularly simple realization. Said voltage is fed to the comparator 8 via a filter 7, as described in the case of FIG. 1. The operational amplifier 8 compares this actual signal with a desired value, two controlled current sources 15, which are connected to the input 2 of the mixer 1 on the load side, being controlled depending on a deviation between actual signal and desired signal. The current sources 15, which preferably have a good pairing in the same way as the controlled voltage sources 13, increase or decrease the DC current component of the input signal depending on said deviation.

In an alternative embodiment of the circuit in accordance with FIG. 2, the latter may also be embodied using asymmetrical circuitry, that is to say designed for carrying single-ended signals. In this case, it is necessary to provide a sufficiently low limiting frequency of the low-pass filter 7.

The circuits in accordance with FIGS. 1 and 2 have the advantage that, with the DC component regulation described, a mixer 1 can be operated at a desired operating point and at the same time a radiofrequency assembly of a mobile radio modulator, for example, can be connected to a baseband signal processing circuit with a virtually arbitrary common-mode component.

Since the regulation described may always be in operation, that is to say activated, during normal operation, that is to say during transmission operation, manufacturing-dictated, temperature-dictated and also ageing-dictated drift effects and tolerances may additionally be compensated for.

FIG. 3 shows, on the basis of a simplified block diagram, the regulation in accordance with FIGS. 1 and 2 applied to a quadrature modulator 16 of a mobile radio transmission arrangement. In this case, the mobile radio transmission arrangement comprises a baseband signal processing block 20.

The quadrature modulator 16 has two radiofrequency mixers 1, of which one is connected to an in-phase signal path I at its signal input and the other is connected to a quadrature signal path Q of a complex-value useful signal at its signal input. Furthermore, the frequency mixers 1 can be fed, at a respective further input, a local oscillator signal which is provided by an oscillator 17 and the frequency of which is divided down in a frequency divider 18, on the one hand unchanged and on the other hand with a phase shift of 90°. The signal outputs of the frequency mixers 1 are in each case connected to a summation element 19, which provides a radiofrequency signal at its output, which signal can be coupled into a transmission antenna, for example.

On the input side at the radiofrequency mixers 1, both in the in-phase signal path I and in the quadrature signal path Q, there is provided in each case a regulation of the common-mode level in accordance with the present principle, for example in accordance with FIG. 1 or 2, which in each case comprises a detector 5 with means for influencing the common-mode level 12 connected upstream and is connected to the radiofrequency mixer on the input side. Furthermore, a comparator 8 is in each case provided in a feedback path, which compares an actual signal provided by the detector 5 with a desired common-mode value that can be fed in at a connection 9, and in each case drives the means for influencing the common-mode level 12 depending on a deviation between desired value and actual value.

The baseband signal processing block 20 is connected to the means for influencing the common-mode level 12 on the input side, said means being provided in I and Q signal paths.

A low-pass filter may additionally be provided in the feedback path between detector 5 and comparator 8.

Depending on whether the radiofrequency mixers 1 have voltage or current inputs, a circuit in accordance with FIG. 1 or FIG. 2 may be provided for common-mode regulation.

Depending on the desired, prescribed operating point of the mixers 1, a corresponding common-mode desired value can be fed in at the connection 9.

The quadrature modulator 16 with the described common-mode level regulation at the input is designed completely using symmetrical circuitry for carrying differential signals.

The connections 9 of the two comparators 8 may be connected to one another.

The quadrature modulator 16 modulates the I and Q signals onto a radiofrequency carrier signal. The input-side regulation described is suitable for ensuring a defined operating point of the mixers 1. This results in an independence of DC components of a useful signal which is provided at a baseband chip on the output side. As a result of this, the described modulator in accordance with FIG. 3 may be combined as a radiofrequency front end constructed using analogue circuitry with virtually any desired baseband chips in order to form a mobile radio transmitter.

The invention claimed is:

1. A circuit arrangement for regulating a DC signal component, comprising:
    a modulator for frequency converting an influenced input signal received at an input of the modulator;
    a detector for detecting a DC component value of the influenced input signal and providing the detected DC component value at an output thereof;
    a comparator having a first input coupled to the output of the detector and configured to receive the detected DC component value thereat, a second input configured to receive a desired reference level, wherein the comparator is configured to generate a control signal at an output thereof as a function of a comparison between the detected DC component value and the reference level; and
    influence circuitry for influencing the DC component of an input signal as a function of the control signal received from the output of the comparator, thereby forming the influenced input signal at an output thereof,
    wherein the detector is connected between the output of the influence circuitry and the input of the modulator.

2. The apparatus of claim 1 including a low-pass filter coupled between the output of the detector and the first input of the comparator.

3. The apparatus of claim 2 wherein the input signal is a symmetrical input signal, and wherein the detector and the input of the modulator each include symmetrical terminals for processing an influenced version of the symmetrical input signal.

4. The apparatus of claim 1 wherein the input signal is a symmetrical input signal, and wherein the detector and the input of the modulator each include symmetrical terminals for processing an influenced version of the symmetrical input signal.

5. The apparatus of claim 4 wherein the detector includes two resistors respectively connected to the symmetrical input terminals of the modulator input, said resistors connected to one another at the output of the detector.

6. The apparatus of claim 5 including a low-pass filter coupled between the output of the detector and the first input of the comparator.

7. The apparatus of claim 4 wherein the detector includes two current-controlled voltage sources in a series-connected configuration the voltage sources having respective control inputs respectively coupled to the symmetrical input terminals of the modulator input, and wherein the series-connected configuration of current-controlled voltage sources is coupled to the output of the detector.

8. The apparatus of claim 7 including a low-pass filter coupled between the output of the detector and the first input of the comparator.

9. The apparatus of claim 1 wherein the DC signal component is a voltage component.

10. The apparatus of claim 9 wherein the detector includes two resistors respectively connected to the symmetrical input terminals of the modulator input, said resistors connected to one another at the output of the detector.

11. The apparatus of claim 1 wherein the DC signal component is a current component.

12. The apparatus of claim 11 wherein the detector includes two current-controlled voltage sources in a series-connected configuration, the voltage sources having respective control inputs respectively coupled to the symmetrical input terminals of the modulator input, and wherein the series-connected configuration of current-controlled voltage sources is coupled to the output of the detector.

13. The apparatus of claim 1 wherein the modulator includes a frequency mixer having a first input connected to the input of the modulator, a second input for receiving a signal having a carrier frequency, and an output for providing a modulated radiofrequency output signal.

14. A mobile radio transmitter apparatus, comprising:
    a modulator for frequency converting an influenced input signal received at an input of the modulator;
    a detector for detecting a DC component value of the influenced input signal and providing the detected DC component value at an output thereof;
    a comparator having a first input coupled to the output of the detector and having a second input for receiving a desired reference level, wherein the comparator is configured to generate a control signal at an output thereof as a function of a comparison between the detected DC component value and the reference level;
    influence circuitry for influencing the DC component of an input signal as a function of the control signal received from the output of the comparator, thereby forming the influenced input signal at an output thereof,
    wherein the detector is connected between the influence circuitry and the modulator; and
    a baseband signal processing unit having an output for providing a useful signal as the input signal, the influence circuitry having a signal input connected to the output of the baseband signal processing unit.

15. The apparatus of claim 14 including a low-pass filter coupled between the output of the detector and the first input of the comparator.

16. The apparatus of claim 15 wherein the input signal is a symmetrical input signal, and wherein the detector and the input of the modulator each include symmetrical terminals for processing an influenced version of the symmetrical input signal.

17. The apparatus of claim 14 wherein the input signal is a symmetrical input signal, and wherein the detector and the input of the modulator each include symmetrical terminals for processing an influenced version of the symmetrical input signal.

18. The apparatus of claim 17 wherein the detector includes two resistors respectively connected to the symmetrical input terminals of the modulator input, said resistors connected to one another at the output of the detector.

19. The apparatus of claim 17 wherein the detector includes two current-controlled voltage sources in a series-connected configuration, the voltage sources having respective control inputs respectively coupled to the symmetrical input terminals of the modulator input, and wherein the series-connected configuration of current-controlled voltage sources is coupled to the output of the detector.

20. The apparatus of claim 14 wherein the modulator includes a frequency mixer having a first input connected to the input of the modulator, a second input for receiving a signal having a carrier frequency, and an output for providing a modulated radiofrequency output signal.

* * * * *